(12) United States Patent
Elimelech (10) Patent No.: US 10,626,233 B2
(45) Date of Patent: *Apr. 21, 2020

(54) SUSPENSION POLYMERIZATION COMPOSITIONS, METHODS AND USES THEREOF

(71) Applicant: Nano Dimension Technologies, LTD, Nes Ziona (IL)

(72) Inventor: Hila Elimelech, Moshav Avigdor (IL)

(73) Assignee: NANO-DIMENSION TECHNOLOGIES, LTD., Nes-Ziona (IL)

( * ) Notice: Subject to any disclaimer, the term of this patent is extended or adjusted under 35 U.S.C. 154(b) by 83 days.

This patent is subject to a terminal disclaimer.

(21) Appl. No.: 15/596,057

(22) Filed: May 16, 2017

(65) Prior Publication Data

US 2017/0298197 A1    Oct. 19, 2017

Related U.S. Application Data

(63) Continuation of application No. 15/523,375, filed as application No. PCT/US2015/058021 on Oct. 29, 2015.

(Continued)

(51) Int. Cl.
*C08J 5/18* (2006.01)
*C08G 59/24* (2006.01)
(Continued)

(52) U.S. Cl.
CPC .......... *C08J 5/18* (2013.01); *C08F 222/1006* (2013.01); *C08G 59/184* (2013.01);
(Continued)

(58) Field of Classification Search
CPC .. C08J 5/18; C08J 5/24; C08J 2363/00; C08L 63/00; C08L 33/062; C08K 3/36; C08K 7/26; C08G 59/687; C08G 59/56; C08G 59/46; C08G 59/44; C08G 59/42; C08G 59/184; C08G 59/50; C08G 59/245; C08F 222/1006; C09D 11/30; C09D 11/101; H05K 3/0011; H05K 1/0366; H05K 2203/10; H05K 2203/013
See application file for complete search history.

(56) References Cited

U.S. PATENT DOCUMENTS 4,412,015 A * 10/1983 Lustgarten ............. A61K 6/083
106/467

OTHER PUBLICATIONS

Porter et al. Thermal Characterization of PMMA Thin Films Using Modulated Differential Scanning Calorimetry. Macromolecules (2000) vol. 33 No. 19, pp. 7016 to 7020. (Year: 2000).*

(Continued)

*Primary Examiner* — Sanza L. McClendon
(74) *Attorney, Agent, or Firm* — Guy Levi; The IP Law Firm of Guy Levi, LLC (57) ABSTRACT

The disclosure relates to thermosetting reinforced resin compositions and methods of forming boards, sheets and/or films using of porous particulates impregnated with embedded live monomer and/or oligomer and/or polymer configured to partially leach out a functional terminal end of the live monomer and/or oligomer and/or polymer and react with a cross-linking agent and photoinitiated polymer radicals to form a reinforced board, sheet and/or film of hybrid interpenetrating networks.

11 Claims, 2 Drawing Sheets

Related U.S. Application Data (60) Provisional application No. 62/069,875, filed on Oct. 29, 2014.

(51) Int. Cl.

| | |
|---|---|
| *C08G 59/50* | (2006.01) |
| *C08F 222/10* | (2006.01) |
| *C08G 59/18* | (2006.01) |
| *C08G 59/42* | (2006.01) |
| *C08G 59/44* | (2006.01) |
| *C08G 59/46* | (2006.01) |
| *C08G 59/56* | (2006.01) |
| *C08G 59/68* | (2006.01) |
| *C08K 3/36* | (2006.01) |
| *C08L 33/06* | (2006.01) |
| *C08L 63/00* | (2006.01) |
| *C08J 5/24* | (2006.01) |
| *H05K 1/03* | (2006.01) |
| *H05K 3/00* | (2006.01) |
| *C08K 7/26* | (2006.01) |
| *C09D 11/101* | (2014.01) |
| *C09D 11/30* | (2014.01) |

(52) U.S. Cl.
CPC ........... *C08G 59/245* (2013.01); *C08G 59/42* (2013.01); *C08G 59/44* (2013.01); *C08G 59/46* (2013.01); *C08G 59/50* (2013.01); *C08G 59/56* (2013.01); *C08G 59/687* (2013.01); *C08J 5/24* (2013.01); *C08K 3/36* (2013.01); *C08K 7/26* (2013.01); *C08L 33/062* (2013.01); *C08L 63/00* (2013.01); *C09D 11/101* (2013.01); *C09D 11/30* (2013.01); *H05K 1/0366* (2013.01); *H05K 3/0011* (2013.01); *C08J 2363/00* (2013.01); *H05K 2203/013* (2013.01); *H05K 2203/10* (2013.01)

(56) References Cited

OTHER PUBLICATIONS

Zou et al. Polymer/Silica Nanocomposites: Preparation, Characterization, Properties, and Applications. Chemical Review s (2008) 108, pp. 3893-3957. (Year: 2008).*

* cited by examiner

SUSPENSION POLYMERIZATION COMPOSITIONS, METHODS AND USES THEREOF

This patent application is a Continuation of U.S. application Ser. No. 15/523,375, filed Apr. 29, 2017, which is the U.S. National Phase filing of now expired, commonly owned PCT Application No. PCT/US2015/058021, filed Oct. 29, 2015, which is based on and claims the benefit of the filing date of U.S. Provisional Patent Application Ser. No. 62/069,875, filed Oct. 29, 2014, all which are incorporated herein by reference in their entirely.

BACKGROUND

The disclosure is directed to a thermosetting reinforced resin compositions and methods of forming boards, sheets and/or films. Specifically, the disclosure relates to compositions and methods using of porous particulates impregnated with live monomer and/or oligomer and/or polymer configured to partially leach out a functional terminal end of the live monomer and/or oligomer and react with a cross-linking agent to form a reinforced board, sheet and/or film.

Various electronic and other devices such as computers, semiconductor devices, displays, and communication devices include printed electronic circuit boards. A printed electronic circuit board may include signal lines for transferring signals, insulating layers for preventing a short circuit between signal lines, switching elements, and the like. The printed electronic circuit board may desirably have various performance factors to provide improved performance. For example, a printed electronic circuit may be formed as a thin film to improve the performance of an electronic device, and the printed electronic circuit may be very small in size. Likewise, thermoset boards sheets and/or films may be useful in forming housing elements of various devices where performance at high temperature may be desirable, as well as other thermoset resin products.

Currently, such board materials may fail to satisfy some of the specifications for next-generation packaging technology, such as excellent physical properties in terms of impact strength, scratch resistance, high heat resistance, low thermal expansion, and low-moisture absorption.

Therefore there remains a need for an improved board material that may provide such specifications.

SUMMARY

Disclosed, in various embodiments, are thermosetting reinforced resin compositions and methods of forming boards, sheets and/or films.

In an embodiment provided herein is a method of forming a reinforced thermoset board, film sheet or an article of manufacture comprising: providing a suspension comprising a dispersed phase comprising: plurality of primary porous particulates impregnated with a monomer, an oligomer, a polymer or a combination comprising the foregoing, wherein the monomer, oligomer, polymer or a combination thereof has a first terminal end coupled to the porous particulate and a functional second terminal end; a continuous phase, comprising: multifunctional acrylate monomer, oligomer, polymer or their combination; a cross-linking agent and a radical photoinitiator, wherein the monomer, oligomer, polymer or their combination impregnated in the porous particulates is partially soluble in the continuous phase or is thermodynamically incompatible with a material forming the particulates; leaching a portion of the monomer, oligomer, polymer or a combination thereof from the porous particulates; contacting the leached monomer, oligomer or a combination thereof with a cross-linking agent, a co-monomer, a co-oligomer, functional polymer or a composition comprising one or more of the foregoing, wherein the cross-linking agent is configured to activate the radical photoinitiator; using the activated the radical photoinitiator, exposing the continuous phase to electromagnetic radiation configured to initiate radical formation in the multifunctional acrylate monomers, oligomers, polymers or their combination; and reacting the monomer, oligomer or a combination thereof from the porous particulates with the cross-linking agent and the radicalized multifunctional acrylate monomers, oligomers, polymers or their combination.

In another embodiment, provided herein is suspension composition comprising: a dispersed phase comprising a plurality of porous particulates impregnated with embedded monomer, oligomer, or a combination comprising the foregoing, wherein the monomer, oligomer or a combination thereof has a first terminal end coupled to the porous particulate and a second, functional terminal end, wherein the monomer, oligomer, polymer, or their combination that is operably coupled to the porous particulates are entirely embedded within the particulates and configured to leach out of the porous particulate at a temperature of between about 60° C. and about 150° C.; and a continuous phase comprising: multifunctional acrylate monomer, oligomer, polymer or their combination; a cross-linking agent; and a radical photoinitiator, wherein the monomer, oligomer, polymer or their combination impregnated in the porous particulates is partially soluble in the continuous phase and/or is thermodynamically incompatible with a material forming the particulates.

In yet another embodiment, provided herein is a kit for forming a reinforced thermoset film comprising a composition comprising a suspension composition comprising: a dispersed phase comprising a plurality of porous particulates impregnated with embedded monomer, oligomer, or a combination comprising the foregoing, wherein the monomer, oligomer or a combination thereof has a first terminal end coupled to the porous particulate and a second, functional terminal end, wherein the monomer, oligomer, polymer, or their combination that is operably coupled to the porous particulates are entirely embedded within the particulates and configured to leach out of the porous particulate at a temperature of between about 60° C. and about 150° C.; and a continuous phase comprising: multifunctional acrylate monomer, oligomer, polymer or their combination; a cross-linking agent; and a radical photoinitiator, wherein the monomer, oligomer, polymer or their combination impregnated in the porous particulates is partially soluble in the continuous phase and/or is thermodynamically incompatible with a material forming the particulates; a composition comprising a cross-linking agent, a co-monomer, a co-oligomer or a composition comprising one or more of the foregoing; optionally packaging materials; and optionally instructions.

In yet another embodiment, provided herein is a board, a printed circuit board, a sheet, film, laminated film, formed using the methods described herein.

In an embodiment, provided herein is an inkjet method of printing a reinforced printed circuit board, comprising providing a first inkjet ink comprising a suspension composition comprising: a dispersed phase comprising a plurality of porous particulates impregnated with embedded monomer, oligomer, or a combination comprising the foregoing, wherein the monomer, oligomer or a combination thereof has a first terminal end coupled to the porous particulate and a second, functional terminal end, wherein the monomer, oligomer, polymer, or their combination that is operably coupled to the porous particulates are entirely embedded within the particulates and configured to leach out of the porous particulate at a temperature of between about 60° C. and about 150° C.; and a continuous phase comprising: multifunctional acrylate monomer, oligomer, polymer or their combination; a cross-linking agent; and a radical photinitiator, wherein the monomer, oligomer, polymer or their combination impregnated in the porous particulates is partially soluble in the continuous phase and/or is thermodynamically incompatible with a material forming the particulates; method of forming a reinforced thermoset board, film sheet or an article of manufacture comprising: heating the peelable substrate to a temperature of between about 60 degrees C. and about 150 degrees C., for example 110 degrees C.; ejecting the suspension composition onto the heated peelable substrate thereby leaching a portion of the monomer, oligomer, polymer or a combination thereof from the porous particulates; contacting the leached monomer, oligomer or a combination thereof with a cross-linking agent, wherein the cross-linking agent is configured to activate the radical photoinitiator; using the activated the radical photoinitiator, exposing the continuous phase to electromagnetic radiation configured to initiate radical formation in the multifunctional acrylate monomers, oligomers, polymers or their combination; and reacting the monomer, oligomer or a combination thereof from the porous particulates with the cross-linking agent and the radicalized multifunctional acrylate monomers, oligomers, polymers or their combination.

These and other features of the compositions and methods for forming a reinforced thermoset board, sheet, film or a laminate comprising one or more layers of the foregoing will become apparent from the following detailed description when read in conjunction with the figures and examples, which are exemplary, not limiting.

BRIEF DESCRIPTION OF THE FIGURES

For a better understanding of the thermosetting reinforced resin compositions and methods of forming boards, sheets and/or films, with regard to the embodiments thereof, reference is made to the accompanying examples and figures, in which.

DETAILED DESCRIPTION

Provided herein are embodiments of thermosetting reinforced resin compositions and methods of forming boards, sheets and/or films.

The curing of a liquid epoxy resin i.e., converting it to a thermoset solid can be fundamental to its commercial use. The same holds true of, polyester, polyurethane, phenolic, and melamine resins. However, liquid epoxy resins, because of their structure and the method of their curing, are superior to these other resins (e.g., phenolic resins) in their dimensional stability during the curing stage, chemical resistance, chemical inertness, durability, adhesion, ability to tailor physico-chemical properties by proper choice of initial epoxy, and the inhibition of volatile loss.

Typically, bisphenol-A/epichlorohydrin based resins, novolac based epoxy resins, and other di- or multifunctional resins containing aromatic ring structure will cure to hard, rigid compositions having rather low impact and elongation characteristics. There are many approaches to improving these properties and increasing flexibility in epoxy resin systems. Among them are modifications with oils, polyamide or polysulfide curing agents, or long chain polyglycols. Such modifiers often adversely affect the physical, chemical, or solvent resistance properties of an epoxy system, or they limit the choice of curing agents and thus limit use in many applications.

Further, to improve the strength and rigidity of a resin molded article obtained from a fiber-reinforced thermoplastic resin, it may be necessary to increase the amount of filler, for example, a fibrous filler (reinforcing agent or toughening agent), which can be blended in a portion of the resin serving as primer. However, when the blended amount of the reinforcing agent is increased, ductility of the fiber-reinforced resin composition may decrease.

Accordingly, provided herein is a composition comprising a suspension of porous particulates impregnated with a monomer, an oligomer, a polymer or a combination comprising the foregoing, wherein the monomer, oligomer, polymer or a combination thereof has a first terminal end coupled to the porous particulate and a second terminal end having for example, an epoxy functionality, wherein the monomer, oligomer, polymer, or their combination that is operably coupled to the porous particulates are entirely embedded within the particulates and configured to leach out of the porous particulate at a temperature of between about 60° C. and about 150° C. The monomer, oligomer, or polymer used in the compositions described herein can have other functional groups as the terminal end of the polymer. Likewise, the oligomer and/or polymer backbone can be induced to form cross links by contacting the polymer with an agent that will form free radicals on the backbone, thereby allowing for cross-linking sites.

Figure 1:
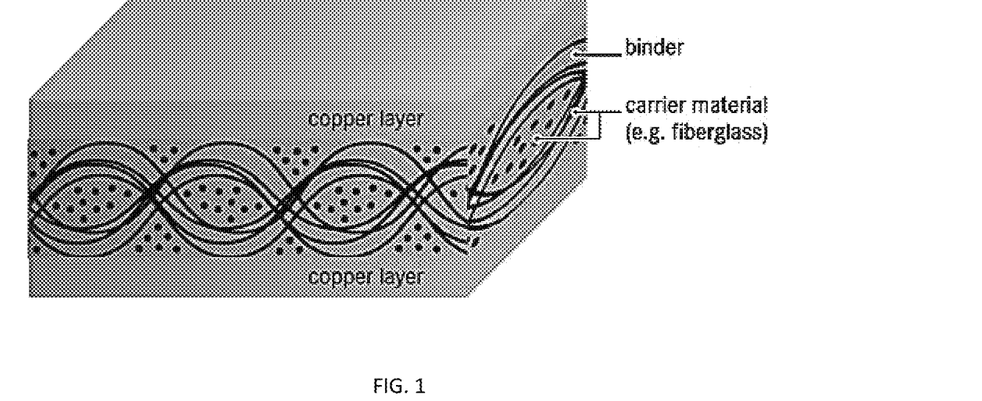
FIG. 1 shows fiberglass reinforced thermoset board formed according to typical methods.
Figure 2A:
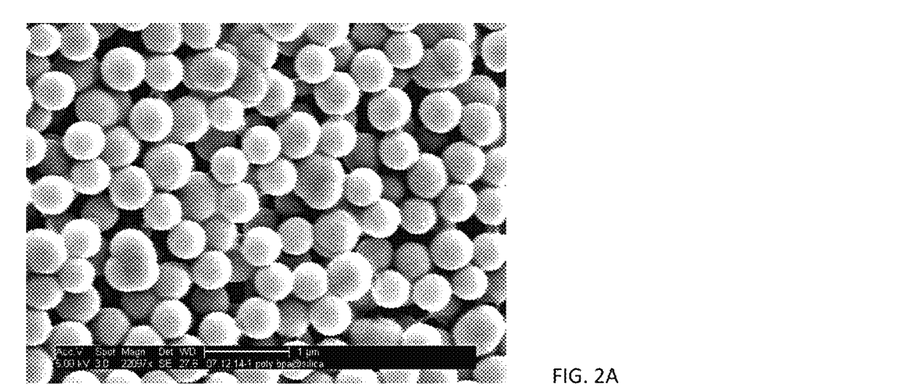
FIG. 2A illustrates a scanning electron microscope capture showing X-Z cross-section of a dispersed phase formed according to the methods described and claimed in an inactivated form, at lower magnification in FIG. 2B and with higher magnification in FIG. 2C.
Figure 2B:
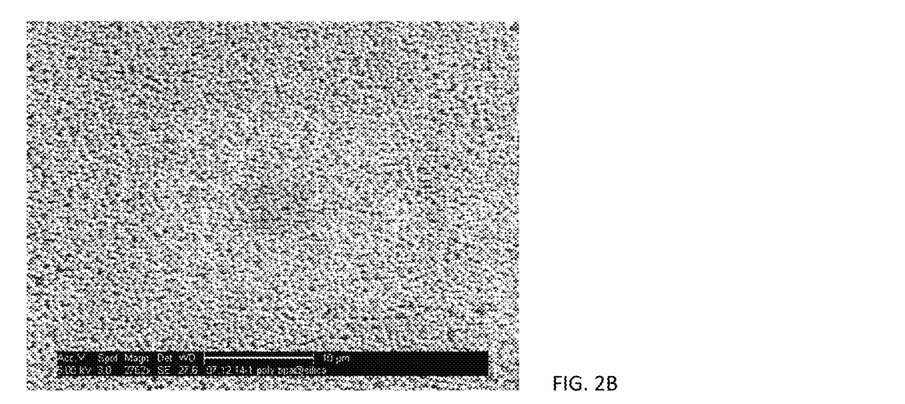
Figure 2C:
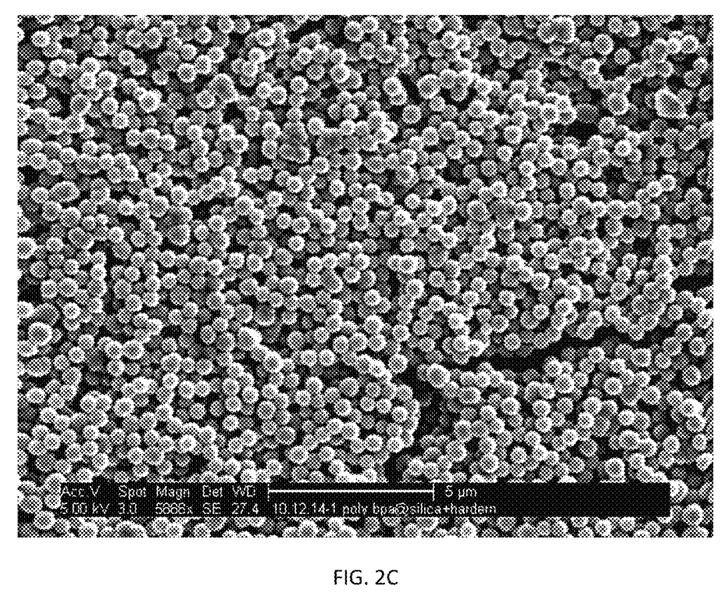
Figure 3:
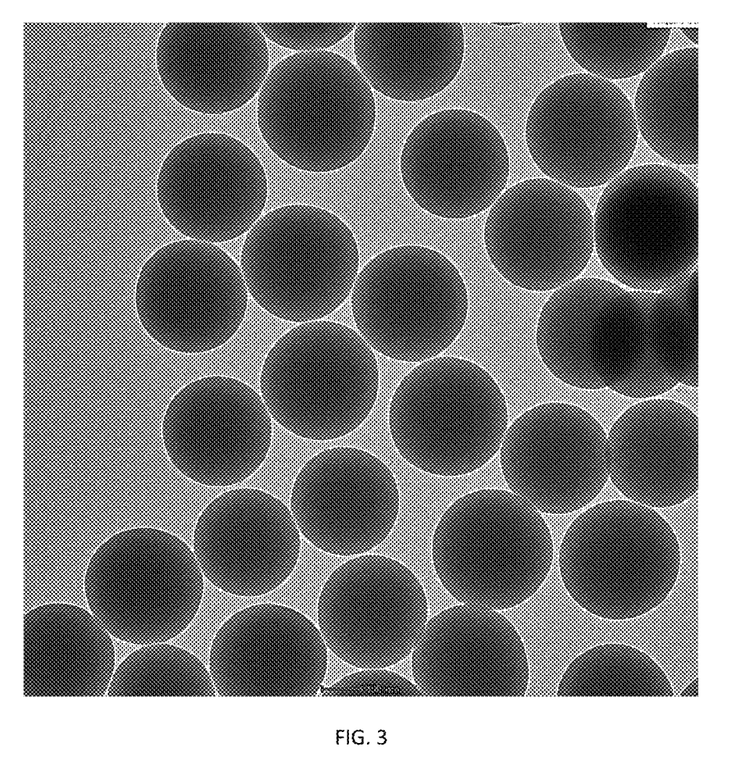
FIG. 3, shows a transmission electron microscope of the dispersed phase formed according to the methods described.

In an inactivated state, the monomer, oligomer, polymer, or their combination is entirely embedded within porous particulates (e.g., beads, see e.g., FIG. 2A) and upon heating, or activation, the live monomer, live oligomer, live polymer or their combination partially leaches out of the porous particulates (see e.g., FIGS. 2B, 2C). Accordingly, the monomer, oligomer, polymer, or their combination is not coupled to the porous particulates by surface modification or surface functionalization of the porous particulates, but rather, through internal modification i.e., physical linkage, forming in an embodiment an integrated hybrid particle. Under these circumstances, it is possible to provide the suspension in combination with a curing agent, or a cross-linking agent, a live, or active co-monomer, co-oligomer, co-polymer or a composition comprising one or more of the foregoing, without thermosetting the mixture. Moreover, by embedding the monomer, oligomer, polymer, or their combination inside the porous particulate used for reinforcing the resin, the reinforcement particulates become integral to the resin polymer or co-polymer's backbone.

In addition, live, or active co-monomer, co-oligomer, co-polymer or a composition comprising one or more of the foregoing, can likewise be impregnated and embedded within a plurality of particulates, that can be the same or different as the particulates impregnated with the monomer, oligomer or polymer forming the resin's backbone. In other words, by entrapping, for example, the cross linking agent within particulates of the same or different material at predetermined concentrations that, depending on the resin-forming monomers, oligomers or polymers and their combination, both particles can be used in a single ink composition and only upon heating or exposure to a swelling agent, release the entrapped components for reacting and forming the resin. Final properties of the board, film, sheet or any other component or device formed accordingly can be tightly control by proper election of various factors, such as, for example:

a. type of monomer used (e.g., bisphenol-F);
b. average weight number MW of the resin-forming polymer/oligomer;
c. concentration within the primary particulate (W/W);
d. Primary particulates concentration (in other words, the particulates that, in an embodiment, are impregnated with the resin monomer (e.g., bisphenol-A)) in the ink (w/w)
e. Type of primary particulates (e.g., silica, mica etc.);
f. Primary particulates formation process (e.g., control pore size, etc);
g. type of cross-linking agent used (e.g., diethylene triamine);
h. average weight number MW of the cross-linking polymer/oligomer;
i. concentration of cross-linking agent within the secondary particulate (W/W);
j. Secondary particulates concentration (in other words, the particulates that, in an embodiment, are impregnated with the cross-linking agent (e.g., triethylene tetraamine)) in the ink (w/w);
k. Type of secondary particulates (e.g., silica, mica etc.);
l. Secondary particulates formation process (e.g., annealing to reduce Vf, etc), or a combination of factors comprising one or more of the foregoing.

The terms "live monomer", "live oligomer", "live polymer" or their counterparts (co-monomer e.g.,) combination refers in an embodiment to a monomer, a short group of monomers or a polymer having at least one functional group capable of forming a radical reaction (in other words, the reaction can be continued and is not otherwise terminated by an end-group) Likewise, the term "embedded", as used for example in connection with the monomer, oligomer, polymer, or their combination being embedded within the mesoporous particulates, is intended to mean that the embedded material is dispersed within the particulate of the mesoporous particulates as may be accomplished, for example, by blending the monomer, oligomer, polymer, or their combination with the materials used to prepare the, for example mesoporous particulate before it is formed into an particulate, e.g., a bead. For example, the live monomer, live oligomer, live polymer or their combination can be combined under certain circumstances with tetraethoxysilane (TEOS) to form mesoporous particle with the live monomer, live oligomer, polymer or their combination, entrapped within the particulate matter. The term "embedded" excludes live monomer, live oligomer, polymer or their combination applied (as in functionalized) to the surface of a preformed particulate of microporous material, or live monomer, live oligomer, or their combination material that has been applied to the surface of a preformed particulate of microporous material and allowed to be adsorbed to an area just below the surface of a preformed particulate of microporous material, as for example by applying ink to the surface of the preformed matrix (dipping). (According to the IUPAC definition, "micropores" are of a diameter<2 nm, "mesopores" have a diameter within the interval of 2-50 nm and "micropores" are of a diameter>50 nm.). Also, in an embodiment, the term "entrapped" refers to the retention for a period of time of the live monomer, live oligomer, live polymer or their combination in the interstitial free volume ($V_f$) of the silica.

Activation of the live monomer, live oligomer, live polymer or their combination, and thus allowing contact between the live monomer, live oligomer, or their combination and, for example, a cross-linking agent to initiate curing, can be caused by increase in the interstitial free volume ($V_f$) of the particulates, resulting from the heating either alone, or in the presence of a swelling agent present in the aqueous phase of the composition. The mechanism may be (without limitation) such that the heat increases the viscosity of the polymer encapsulated within the silica particles and their kinetic energy, once the $V_f$ is larger than the critical segment length of the polymer, oligomer or monomer or their combination, the polymer can begin to flow within the particulate which, in turn can cause the polymer chains to leach out.

Further, the term "impregnate" means for example, to fill throughout or to saturate the porous, or mesoporous particulates with the monomer, oligomer, polymer, or their combination. For example, the porous particulate is impregnated with the live monomer, live oligomer, or polymer or a combination thereof in a concentration of between about 5% and about 80% weight of the monomer, oligomer, polymer, or their combination per weight of the particulate (w/w).

The amount of live monomer, live oligomer, or their combination the porous particulates are impregnated with will change with the desired physic-chemical characteristic of the board, film or sheet sought to be formed. The live monomer, live oligomer or a combination thereof has a number average molecular weight ($\overline{MW}_n$), in other words the average number of monomers per chain of between 1 and about 2000, for example, $\overline{MW}_n$ between 1 and about 1000 or $\overline{MW}_n$ of between about 250 and about 750, specifically between about 300 and about 500.

For example, the porous particulates can be impregnated with a monomer, an oligomer, a polymer or a combination comprising the foregoing, wherein the monomer, oligomer, polymer or a combination thereof has a first terminal end coupled to and embedded in the porous (e.g., microporous or mesoporous) particulate and a second, live terminal end having, for example epoxy functionality containing an active (live) oxirane structure represented by the formula 1:

(1)

which is commonly referred to as an "epoxy" functionality. Liquid epoxy resins can be converted through these reactive epoxy sites into tough, insoluble, and infusible solids.

Epoxy resin used herein can be derived from the reaction of a dihydroxy compound of the structure represented by formula 2:

(2)

wherein $R^a$ and $R^b$ each represent a halogen or $C_{1-12}$ alkyl group and can be the same or different; p and q are each independently integers of 0 to 4; and $X^a$ is a single bond, —O—, —S—, —S(O)—, —S(O)$_2$—, —C(O)—, or a $C_{1-18}$ organic group; and epichlorohydrin is (2,2-bis[4-(2'3' epoxy propoxy) phenyl] propane).

Exemplary dihydroxy compounds can be the following: 4,4'-dihydroxybiphenyl, 1,6-dihydroxynaphthalene, 2,6-dihydroxynaphthalene, bis(4-hydroxyphenyl)methane, bis(4-hydroxyphenyl)diphenylmethane, bis(4-hydroxyphenyl)-1-naphthylmethane, 1,2-bis(4-hydroxyphenyl)ethane, 1,1-bis(4-hydroxyphenyl)-1-phenylethane, 2-(4-hydroxyphenyl)-2-(3-hydroxyphenyl)propane, bis(4-hydroxyphenyl) phenylmethane, 2,2-bis(4-hydroxy-3-bromophenyl) propane, 1,1-bis(hydroxyphenyl)cyclopentane, 1,1-bis(4-hydroxyphenyl)cyclohexane, 1,1-bis(4-hydroxyphenyl) isobutene, 1,1-bis(4-hydroxyphenyl)cyclododecane, trans-2,3-bis(4-hydroxyphenyl)-2-butene, 2,2-bis(4-hydroxyphenyl)adamantine, (alpha, alpha'-bis(4-hydroxyphenyl)toluene, bis(4-hydroxyphenyl)acetonitrile, 2,2-bis(3-methyl-4-hydroxyphenyl)propane, 2,2-bis(3-ethyl-4-hydroxyphenyl)propane, 2,2-bis(3-n-propyl-4-hydroxyphenyl)propane, 2,2-bis(3-isopropyl-4-hydroxyphenyl)propane, 2,2-bis(3-sec-butyl-4-hydroxyphenyl)propane, 2,2-bis(3-t-butyl-4-hydroxyphenyl)propane, 2,2-bis(3-cyclohexyl-4-hydroxyphenyl)propane, 2,2-bis(3-allyl-4-hydroxyphenyl)propane, 2,2-bis(3-methoxy-4-hydroxyphenyl)propane, 2,2-bis(4-hydroxyphenyl)hexafluoropropane, 1,1-dichloro-2,2-bis(4-hydroxyphenyl)ethylene, 1,1-dibromo-2,2-bis(4-hydroxyphenyl)ethylene, 1,1-dichloro-2,2-bis(5-phenoxy-4-hydroxyphenyl)ethylene, 4,4'-dihydroxybenzophenone, 3,3-bis(4-hydroxyphenyl)-2-butanone, 1,6-bis(4-hydroxyphenyl)-1,6-hexanedione, ethylene glycol bis (4-hydroxyphenyl)ether, bis(4-hydroxyphenyl)ether, bis(4-hydroxyphenyl) sulfide, bis(4-hydroxyphenyl)sulfoxide, bis (4-hydroxyphenyl)sulfone, 9,9-bis(4-hydroxyphenyl) fluorine, 2,7-dihydroxypyrene, 6,6'-dihydroxy-3,3,3',3'-tetramethylspiro(bis)indane ("spirobiindane bisphenol"), 3,3-bis(4-hydroxyphenyl)phthalide, 2,6-dihydroxydibenzo-p-dioxin, 2,6-dihydroxythianthrene, 2,7-dihydroxyphenoxathin, 2,7-dihydroxy-9,10-dimethylphenazine, 3,6-dihydroxydibenzofuran, 3,6-dihydroxydibenzothiophene, and 2,7-dihydroxycarbazole, resorcinol, substituted resorcinol compounds such as 5-methyl resorcinol, 5-ethyl resorcinol, 5-propyl resorcinol, 5-butyl resorcinol, 5-t-butyl resorcinol, 5-phenyl resorcinol, 5-cumyl resorcinol, 2,4,5,6-tetrafluoro resorcinol, 2,4,5,6-tetrabromo resorcinol, or the like; catechol; hydroquinone; substituted hydroquinones such as 2-methyl hydroquinone, 2-ethyl hydroquinone, 2-propyl hydroquinone, 2-butyl hydroquinone, 2-t-butyl hydroquinone, 2-phenyl hydroquinone, 2-cumyl hydroquinone, 2,3,5,6-tetramethyl hydroquinone, 2,3,5,6-tetra-t-butyl hydroquinone, 2,3,5,6-tetrafluoro hydroquinone, 2,3,5,6-tetrabromo hydroquinone, and the like, as well as combinations comprising at least one of the foregoing dihydroxy compounds.

Specific examples of bisphenol compounds that can be represented by formula (2) can be, for example also; 1,1-bis(4-hydroxyphenyl)methane, 1,1-bis(4-hydroxyphenyl) ethane, 2,2-bis(4-hydroxyphenyl)propane (hereinafter "bisphenol A" or "BPA"), 2,2-bis(4-hydroxyphenyl) butane, 2,2-bis(4-hydroxyphenyl)octane, 1,1-bis(4-hydroxyphenyl) propane, 1,1-bis(4-hydroxyphenyl)n-butane, 2,2-bis(4-hydroxy-1-methylphenyl)propane, 1,1-bis(4-hydroxy-t-butylphenyl)propane, 3,3-bis(4-hydroxyphenyl)phthalimidine, 2-phenyl-3,3-bis(4-hydroxyphenyl)phthalimidine (PPPBP), and 1,1-bis(4-hydroxy-3-methylphenyl)cyclohexane (DMBPC). Combinations comprising at least one of the foregoing dihydroxy compounds can also be used.

When the dihydroxy compound is, for example; bisphenol-A, the resin is commonly called the diglycidyl ether of bisphenol A (DGEBA) and can be represented by the structure of formula 3:

Higher number of dihydroxy compound (e.g., bisphenol-A units), forming higher molecular weight homologs can be represented by the theoretical structure in formula 4:

wherein n, the integer number of repeating units of diglycidyl ether of the dihydroxy compound that the resin was derived from (e.g., DGEBA) can be between 0.1 and about 2000 repeating units.

The number 'n (an average number) of DGE-Dihydroxy, as well as the type of dihydroxy compound, can be used to predetermine (in other words, design) the physico-chemical characteristic of the reinforced board/film/sheet (BFS) formed using the compositions and methods described herein. For example, the repeating unit is DGEBA and n, is on average between about 2 and about 1000, or between about 10 and about 20, specifically between about 10 and about 200, or between about 5 and about 50, more specifically, between about 1 and about 25, or between about 15 and about 25 DGEBA repeating units.

Increase in weight and number average molecular weight the hydroxy groups on the backbone (enol) introduce an additional reactive site, which can react at higher temperatures with anhydrides, organic acids, amino resins, and phenolic resins, or with epoxide groups (when catalyzed) to give additional cross-linking sites.

In an embodiment, the compositions described herein are used in the methods provided. Accordingly, provided herein is a method of forming a reinforced thermoset board, film or sheet comprising: providing a suspension comprising a dispersed phase comprising: plurality of porous particulates impregnated with an embedded monomer, a (embedded) oligomer, a polymer or a combination comprising the foregoing, wherein the (preactivated embedded) live monomer, live oligomer, polymer (see e.g., FIG. 2A-2C, impregnated with poly(bisphenol A-co-epichlorohydrin) glycidyl end capped (free tale), average Mn 377 gr/mol@ silica) or a combination thereof has a first terminal end coupled to the porous particulate and a second terminal end (e.g., the glycidyl cap end) having epoxy functionality; and a continuous phase, wherein the monomer, oligomer or their combination is either at least partially soluble in the continuous phase, or is not thermodynamically compatible with the material forming the particulate; leaching (or activating) a portion of the live monomer, live oligomer or a combination thereof from the porous particulates; contacting the leached live monomer, live oligomer, polymer or a combination thereof with a cross-linking agent, a co-monomer, a co-oligomer or a composition comprising one or more of the foregoing; reacting the monomer, oligomer, polymer or a combination thereof from the porous particulates with the cross-linking agent, co-monomer, (live, or initiated e.g.) co-oligomer a copolymer or a composition comprising one or more of the foregoing, forming a reinforced cross-linked polymer, a reinforced copolymer or a combination thereof; and substantially removing the continuous phase.

In another embodiment, provided herein is a method of forming a reinforced thermoset board, film, sheet or an article of manufacture comprising: providing a suspension comprising a dispersed phase comprising: plurality of primary porous particulates impregnated with an embedded monomer, an (embedded) oligomer, an embedded polymer or a combination comprising the foregoing, wherein the (preactivated embedded) monomer, oligomer, polymer or a combination thereof is capable of being initiated and has a first terminal end coupled to the porous particulate and a second functional terminal end; and a continuous phase, wherein the monomer, oligomer, polymer or their combination is either at least partially soluble in the continuous phase, or is not thermodynamically compatible with the material forming the particulate; leaching (or activating) a portion of the live monomer, live oligomer or a combination thereof from the porous particulates; contacting the leached monomer, oligomer, polymer or a combination thereof with a cross-linking agent, a co-monomer, a co-oligomer or a composition comprising one or more of the foregoing, wherein the co-monomer, a co-oligomer or a composition comprising one or more of the foregoing is embedded or physically entrapped within a plurality of secondary particulates; reacting the monomer, oligomer, polymer or a combination thereof from the porous particulates with the cross-linking agent, co-monomer, (live, or initiated e.g.) co-oligomer a copolymer or a composition comprising one or more of the foregoing, forming a reinforced cross-linked polymer, a reinforced copolymer or a combination thereof; and substantially removing the continuous phase, wherein the step of leaching (or activating) a portion of the live monomer, live oligomer or a combination thereof from the porous particulates causes leaching of the co-monomer, a co-oligomer or a composition comprising one or more of the foregoing from the secondary particulates.

Initiating the resin backbone can be done using an initiator, for example benzoyl peroxide (BP) and other peroxide-containing compounds. The term "initiator" as used herein generally refers to a substance that initiates a chemical reaction, specifically any compound which initiates polymerization, or produces a reactive species which initiates polymerization, including, for example and without limitation, co-initiators and/or photoinitiator(s).

In another embodiment, the continuous phase comprises active components of a polymer capable of undergoing photoinitiation using a photoinitiator. Such live monomer, live oligomer, live polymer or their combination capable of undergoing photoinitiation can be for example, multifunctional acrylates, for example a multifunctional acrylate that can be multifunctional acrylate is selected from the group consisting of 1,2-ethanediol diacrylate, 1,3-propanediol diacrylate, 1,4-butanediol diacrylate, 1,6-hexanediol diacrylate, dipropylene glycol diacrylate, neopentyl glycol diacrylate, ethoxylated neopentyl glycol diacrylate, propoxylated neopentyl glycol diacrylate, tripropylene glycol diacrylate, bisphenol-A-diglycidyl ether diacrylate, hydroxypivalic acid neopentanediol diacrylate, ethoxylated bisphenol-A-diglycidyl ether diacrylate, polyethylene glycol diacrylate, trimethylolpropane triacrylate, ethoxylated trimethylolpropane triacrylate, propoxylated trimethylolpropane triacrylate, propoxylated glycerol triacrylate, tris(2-acryloyloxyethyl) isocyanurate, pentaerythritol triacrylate, ethoxylated pentaerythritol triacrylate, pentaerythritol tetraacrylate, ethoxylated pentaerythritol tetraacrylate, ditrimethylolpropane tetraacrylate, dipentaerythritol pentaacrylate and dipentaerythritol hexaacrylate.

Photoinitiators that can be used with the multifunctional acrylates described herein can be, for example radical photoinitiator. These radical photoinitiators can be, for example Irgacure® 500 from CIBA SPECIALTY CHEMICAL and Darocur® 1173, Irgacure® 819, Irgacure® 184, TPO-L (ethyl(2,4,6, trimethyl benzoil) phenyl phosphinate) benzophenone and acetophenone compounds and the like. For example, the radical photoinitiator can be cationic photoinitiator, such as mixed triarylsulfonium hexafluoroantimonate salts. Another example of the radical photoinitiator used in the active continuous phase described herein, can be 2-ispropylthioxanthone.

In an embodiment, the methods of forming a reinforced thermoset board, film or sheet (BFS) described herein can be done in a single pot process. In other words, since the preactivated embedded live monomer, live oligomer or a combination thereof are not reactive, the particulates can be suspended in a continuous phase comprising secondary particulates impregnated with the embedded cross-linking agent, (live) co-monomer, co-oligomer, co-polymer or a composition comprising one or more of the foregoing.

The cross linking agent used in the compositions, kits and methods described herein, for forming a reinforced thermoset BFS or other articles of manufacture can be, for example, a primary or secondary polyamine and adducts thereof, or in another example, an anhydride, a polyamide, a $C_4$-$C_{30}$ polyoxyalkylene in which the alkylene groups each independently comprise 2 to 6 carbon atoms, or a composition comprising one or more of the foregoing. The amines cross-linking agents and bisphenol-A initiators can be present at a concentration of between about 0.05 (weight amine compound/w total composition of dispersed and continuous phase (w/w)) and about 10% (w/w). The amine compounds are, in an embodiment, the cross-linking agents described herein.

Primary amine compounds used can be, for example, aliphatic amine compounds having the general structure represented by formula 5:

$$(Et)_n(NH)_{n+1} \quad (5)$$

where Et is the ethylene units and NH are the amine units and wherein n is an integer between 2 and 6.

Primary amines can be, for example, ethylene diamine, diethylene triamine, triethylene tetramine, tetraethylene pentamine. Adducts of the above amines can also be used with epoxy resins, diluents, or other amine-reactive compounds, for example ethyl 4-dimethyl amniobenzoate. In addition, aromatic amines, such as, for example; metaphenylene diamine and diamino diphenyl sulfone, can also be used to achieve higher heat distortion tolerance temperatures. With aromatic amines the activation temperature employed at which the embedded live monomer, live oligomer or a combination thereof impregnating the porous (e.g., microporous or mesoporous) particulate is adapted or configured to leach out of the porous particulate, for example, silica beads, can be elevated, for example between about 100° C. and about 150° C.

The reaction of a primary amine with an epoxy can be represented by the structure of formula 6:

(6)

The reaction can result with a secondary amine that can react further and form the general structure represented by formula 7:

(7)

In an embodiment, and since most aromatic polyamines are solids they could be incorporated as part of the suspension and be selected with a melting temperature that is comparable to the activation temperature enabling the leaching of the live epoxy terminal end of the embedded monomers and oligomers (embedded in the impregnated porous particulates) under these circumstances, pot life and therefore control can be considerably longer than with aliphatic polyamines, whereby elevated temperature cures are used to develop optimum physico-chemical properties. In addition the amine compunds described herein can be configured to activate the radical photoinitiators described herein.

Likewise, solid anhydrides can be used to cure epoxy resins. and used in a similar manner as aromatic amines. Reaction involves keto-enol reactions among the keto groups on the anhydride and secondary hydroxyl on the resin forming polymer. The initial reaction is an esterification, followed by interesterificaion. At low temperature cures, the ether and ester reactions typically take place at about the same rate. However, at higher temperatures, the ester linkage occurs more frequently, accordingly, when elevated temperatures are used, for example, to leach out the monomer or oligomer, polymer and their combination, choice of n repeating units may be designed to provide the desired properties.

The porous particulates used in the compositions, kits and methods described herein, for forming a reinforced thermoset BFS can be, porous silica beads having mean diameter ($D_{2,1}$) of between about 10 nm and about 1000 nm. $D_{2,1}$, refers to the average volume assuming a sphere divided by the average area assuming a circle, of a representative sample of particulates. Using this measure may be important since the embedded monomer, oligomer, polymer or a combination thereof impregnating the microporous, or mesoporous particulates and the particulates are to be incorporated into the resin backbone, rather than reside as fillers among the resin's cured polymerized chains.

Moreover, the suspended porous particulates' concentration in the dispersed phase used in the compositions, kits and methods described herein, for forming a reinforced thermoset BFS can be equal to or greater than the 2D bond percolation threshold once the embedded monomer, oligomer, polymer or their combination has leached out and below a size-dependent volume concentration conferring on the dispersed phase and the overall composition apparent viscosity of between about 0.1 cP·s and about 30 cP·s before activation. For example, when the compositions described herein of the impregnated silica particulates described, dispersed in the multifunctional acrylates described are used as ink, the apparent viscosity can be between about 8 cP·s and about 15 cP·s before activation at a printer head temperature of between about 35° C. and about 55° C.

Furthermore, the active medium component of the continuous phase, or in other words, the portion of the continuous phase capable of interacting with the leached live monomer, live oligomer, live polymer or their combination, can have a fractional concentration of between about 80% and 100% of the continuous phase. The percent fractional concentration of the active medium component in the continuous phase, can be a factor of the desired layer thickness of the thermoset reinforced resin board. For example, the higher the concentration of the fractional concentration of the active medium component in the continuous phase, the thinner is the layer formed. The thermoset resin board can therefore form over a period of between about 0.1 seconds and about 5 seconds.

In an embodiment, the term "percolation" is assigned to the theory of connectivity of particles in randomized lattice structures. Likewise, the term "percolation threshold" is used herein to refer, for example, to a state achieved when a particulate reinforced phase forms a continuous, at least two dimensional (2D) interconnecting network throughout the bulk resin. In other words, the continuous particulate reinforced phase is one where the cross-linked polymer phase is substantially uniformly distributed within the bulk phase.

The porous particulate used in the compositions, kits and methods described herein, for forming a reinforced thermoset BFS with improved machinability can be, for example, powdered aluminum or copper, calcium carbonate, or calcium silicate, or a composition comprising one or more of the foregoing. In another example, the porous particulate used in the compositions, kits and methods described herein, for forming a reinforced thermoset BFS with improved abrasion resistance can be; alumina, flint powder, carborundum, silica, molybdenum disulfide, or a composition comprising one or more of the foregoing; or mica, silica, powdered glass for improved electrical properties.

The suspension may require the presence of a surfactant and optionally a cosurfactants. The surfactants and/or cosurfactants may be cationic surfactants, anionic surfactants, non-ionic surfactant and amphiphilic copolymers, such as block copolymers.

Cationic surfactants useful in the methods provided, can include for example compounds containing quaternary ammonium hydrophilic moieties in the molecule which are positively charged, such as quaternary ammonium salts represented by $R^1R^2R^3R^4N^+X^-$ where $R^1$ to $R^6$ are alkyl groups containing 1-30 carbon atoms, or alkyl groups derived from tallow, coconut oil, or soy; and X is halogen such as chlorine or bromine, or X can be a methosulfate group. Examples are dialkyldimethyl ammonium salts represented by $R^5R^6N^+(CH_3)_2X^-$, where $R^5$ and $R^6$ are alkyl groups containing 12-30 carbon atoms, or alkyl groups derived from tallow, coconut oil, or soy; and X is halogen or a methosulfate group. Monoalkyltrimethyl ammonium salts can also be employed, and are represented by $R^7N^+(CH_3)_3X^-$ where $R^7$ is an alkyl group containing 12-30 carbon atoms, or an alkyl group derived from tallow, coconut oil, or soy; and X is halogen or a methosulfate group. Representative quaternary ammonium salts are dodecyltrimethyl ammonium bromide (DTAB), didodecyldimethyl ammonium bromide, dihexadecyldimethyl ammonium chloride, dihexadecyldimethyl ammonium bromide, dioctadecyldimethyl ammonium chloride, dieicosyldimethyl ammonium chloride, didocosyldimethyl ammonium chloride, dicoconutdimethyl ammonium chloride, ditallowdimethyl ammonium chloride, and ditallowdimethyl ammonium bromide, cetyltrimethylammonium bromide (CTAB), tetradecyltrimethylammonium bromide, didecyldimethylammonium bromide, or a combination thereof. These and other quaternary ammonium salts are commercially available under names such as ADOGEN, ARQUAD, SERVAMINE, TOMAH, and VARIQUAT.

Example of non-ionic surfactants and/or cosurfactants may be: polyoxyethylene fatty alcohol ethers, polyoxyethylene sorbitan fatty acid esters, polyoxyethylene fatty acid esters, polyoxyethylene-derivatized lipids such as Mpeg-PSPC (palmitoyl-stearoyl-phophatidylcholine), Mpeg-PSPE (palmitoyl-stearoyl-phophatidylethanolamine), sorbitan esters, glycerol monostearate, polyethylene glycols, polypropylene glycols, cetyl alcohol, cetostearyl alcohol, stearyl alcohol, aryl alkyl polyether alcohols, polyoxyethylene-polyoxypropylene copolymers, polaxamines, methylcellulose, hydroxycellulose, hydroxy propylcellulose, hydroxy propylmethylcellulose, noncrystalline cellulose, polysaccharides, starch, starch derivatives, hydroxyethylstarch, polyvinyl alcohol, and polyvinylpyrrolidone.

Examples of anionic surfactants and/or cosurfactants may be: sulfonic acids and their salt derivatives; alkali metal sulfosuccinates; sulfonated glyceryl esters of fatty acids such as sulfonated monoglycerides of coconut oil acids; salts of sulfonated monovalent alcohol esters such as sodium oleyl isothionate; amides of amino sulfonic acids such as the sodium salt of oleyl methyl tauride; sulfonated products of fatty acid nitriles such as palmitonitrile sulfonate; sulfonated aromatic hydrocarbons such as sodium alpha-naphthalene monosulfonate; condensation products of naphthalene sulfonic acids with formaldehyde; sodium octahydro anthracene sulfonate; alkali metal alkyl sulfates such as sodium lauryl (dodecyl) sulfate (SDS); ether sulfates having alkyl groups of eight or more carbon atoms; and alkylaryl sulfonates having one or more alkyl groups of eight or more carbon atoms.

Examples of amphiphilic block copolymers used as surfactants and/or cosurfactants can comprise an amphiphilic block copolymer of at least one hydrophobic block and at least one hydrophilic block, wherein the block copolymer self-assembles in aqueous solutions to form the particles. The block copolymer can be tactic, atactic, syndiotactic, or a composition comprising one or more of the foregoing. For example, a PEG-containing block copolymer, having a predetermined molecular weight and block configuration can be adsorbed to an ERC of appropriate size, and a metal oxide, such as silica can be further attached to the surface of such a treated polymer. Micellar systems may also display the same useful characteristics as described above, including micelles formed from AB (in other words atactic) and ABA (in other words, syndiotactic) block copolymers of, for example, poly(ethylene glycol) and PPS. When such copolymers are formed with a molecular fraction of poly(ethylene glycol) that is relatively high, e.g., in excess of approx. 40%, then spherical micelles can be expected to form under certain conditions. These micelles can be small, e.g., meeting the size mentioned above for thermodynamic stability, and may optionally be grafted with an overlayer of PEG, or otherwise incorporate PEG or other polymers to achieve similar properties. The block copolymer can terminate in a hydroxyl group, for complement activation, and it may particularly be beneficial to have the hydrophilic block terminate in a hydroxyl group, so that this hydroxyl group will be more readily available on the micellar nanoparticle surface for complement binding or inversion if necessary. Such hydroxylated surfaces can be tailored to effectively activate complement cosolvent or colloidal adsorbent such as a metal oxide. In addition to micelle-forming polymer architectures, block sizes and block size ratios can be selected to form vesicular structures, which in an embodiment; will depend on the metal precursor seeds sought to be encapsulated. There can also exist a number of other possible chemical compositions of micellar formulations that may be used.

Other surfactants and/or cosurfactants useful in the emulsions forming the precursor solutions described herein can be pluronic (PEG-PPG-PEG, HLB=1-7 and 15-23), Brij 92, Poly(glycerol)poly(ricinoleate) (PGPR), Abil EM, PE-block-PEG (tactic, atactic or syndiotactic), CTAC, Sorbitan Monostearate (Span60), PEO20-Sorbitan mono-oleate (Tween 80), bis-(2-ethylhexyl)sulfosuccinate (AOT) or a combination comprising one or more of the foregoing.

The compositions comprising the suspended porous particulates impregnated with embedded live monomer, live oligomer, polymer or a combination thereof has a first terminal end coupled to the porous particulate and a second, functional terminal end, the cross-linking agent, the live co-monomer, live co-oligomer, polymer or a composition comprising one or more of the foregoing, can be prepared by forming a suspension or a mixture (by mixing, admixing) of the components together, permitting formation of a substantially homogenous and stable suspension/mixture. The term "Suspension" or "dispersion" refers to a mixture, preferably finely divided, of two or more phases (solid, liquid or gas), such as, for example liquid in liquid, solid in solid, gas in liquid, and the like which preferably can remain stable for extended periods of time.

In an embodiment, the apparent viscosity of the suspension or liquid composition comprising the foregoing, can be between about 1 mP·s and about 30 cP·s (mPa·s). For example, the suspension can be between about 0.1 cP·s and about 25 cP·s, or between about 1 cP·s and about 20 cP·s, specifically, between about 5 cP·s and about 15 cP·s. The term "apparent viscosity" is used herein to describe the flow characteristics of the combination of the flowable suspension and intermixed continuous phase.

The term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives.

All ranges disclosed herein are inclusive of the endpoints, and the endpoints are independently combinable with each other. "Combination" is inclusive of blends, mixtures, alloys, reaction products, and the like. The terms "a", "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the particulate(s) includes one or more particulate). Reference throughout the specification to "one embodiment", "another embodiment", "an embodiment", and so forth, when present, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments.

All ranges disclosed herein are inclusive of the endpoints, and the endpoints are independently combinable with each other. Furthermore, the terms "first," "second," and the like, herein do not denote any order, quantity, or importance, but rather are used to denote one element from another.

Likewise, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

Accordingly, provided herein is a suspension composition comprising: a dispersed phase comprising a plurality of porous particulates impregnated with embedded monomer, oligomer, or a combination comprising the foregoing, wherein the monomer, oligomer or a combination thereof has a first terminal end coupled to the porous particulate and a second, functional terminal end, wherein the monomer, oligomer, polymer, or their combination that is operably coupled to the porous particulates are entirely embedded within the particulates and configured to leach out of the porous particulate at a temperature of between about 60° C. and about 150° C.; and a continuous phase comprising: multifunctional acrylate monomer, oligomer, polymer or their combination; a cross-linking agent; and a radical photinitiator, wherein the monomer, oligomer, polymer or their combination impregnated in the porous particulates is partially soluble in the continuous phase and/or is thermodynamically incompatible with a material forming the particulates, wherein (i) the porous particulates are porous silica beads having mean diameter ($D_{2,1}$) of between about 10 nm and about 1000 nm, (ii) the suspended porous particulate concentration in the dispersed phase is equal to or greater than the 2D bond percolation threshold and below a size-dependent volume concentration conferring on the dispersed phase apparent viscosity of between about 0.1 cP·s and about 30 cP·s at a temperature of between about 35° C. and about 55° C., (iii) the porous particulate is impregnated with the monomer, oligomer, polymer or a combination thereof in a concentration of between about 5% and about 80% (w/w), wherein (iv) the monomer, oligomer, polymer or a combination thereof has a number average molecular weight ($\overline{MW_n}$) of between 2 and about 2000, (n) is independently derived from a dihydroxy compound of the formula:

wherein $R^a$ and $R^b$ each represent a halogen or $C_{1-12}$ alkyl group and can be the same or different; p and q are each independently integers of 0 to 4; and $X^a$ is a single bond, —O—, —S—, —S(O)—, —S(O)$_2$—, —C(O)—, or a $C_{1-18}$ organic group, (v) the live oligomer has a first terminal end operably coupled to and embedded in the porous particulate and a second terminal end having epoxy and is derived from bisphenol-A, (for example, could also be bisphenol-F) (vi) further comprising a cross-linking agent, such as a primary or secondary amine and adducts thereof, an anhydride, a polyamide, a $C_4$-$C_{30}$ polyoxyalkylene (e.g., polyoxybutylene, POB) in which the alkylene groups each independently comprise 2 to 6 carbon atoms, or a composition comprising one or more of the foregoing, the primary or secondary polyamine can be ethylene diamine, diethylene triamine, triethylene tetramine, tetraethylene pentamine, polyfunctional metaphenylene diamine, diamino diphenyl sulfone and mixtures comprising one or more of the foregoing, and/or the $C_4$-$C_{30}$ polyoxyalkylene in which the alkylene groups each independently comprise 2 to 6 carbon atoms, is a poly(oxymethylene), poly(oxyethylene), poly(oxypropylene), poly(oxybutylene) or a composition comprising one or more of the foregoing at a concentration (w/w) of between about 0.05% (w/w composition) and about 10% (w/w composition), wherein (ix) the multifunctional acrylate is 1,2-ethanediol diacrylate, 1,3-propanediol diacrylate, 1,4-butanediol diacrylate, 1,6-hexanediol diacrylate, dipropylene glycol diacrylate, neopentyl glycol diacrylate, ethoxylated neopentyl glycol diacrylate, propoxylated neopentyl glycol diacrylate, tripropylene glycol diacrylate, bisphenol-A-diglycidyl ether diacrylate, hydroxypivalic acid neopentanediol diacrylate, ethoxylated bisphenol-A-diglycidyl ether diacrylate, polyethylene glycol diacrylate, trimethylolpropane triacrylate, ethoxylated trimethylolpropane triacrylate, propoxylated trimethylolpropane triacrylate, propoxylated glycerol triacrylate, tris(2-acryloyloxyethyl)

isocyanurate, pentaerythritol triacrylate, ethoxylated pentaerythritol triacrylate, pentaerythritol tetraacrylate, ethoxylated pentaerythritol tetraacrylate, ditrimethylolpropane tetraacrylate, dipentaerythritol pentaacrylate and dipentaerythritol hexaacrylate or a multifunctional acrylate composition comprising one or more of the foregoing, wherein (xi) the radical photoinitiator is ethyl(2,4,6, trimethyl benzoil) phenyl phosphinate), benzophenone and acetophenone compounds, mixed triarylsulfonium hexafluoroantimonate salts, 2-ispropylthioxanthone or a radical photinitiator composition comprising one or more of the foregoing present at a concentration of between about 80% (w/w composition) and 99.45% (w/w composition).

In another embodiment, provided herein is an inkjet method of printing a reinforced printed circuit board, comprising providing a first inkjet ink comprising a suspension composition comprising: a dispersed phase comprising a plurality of porous particulates impregnated with embedded monomer, oligomer, or a combination comprising the foregoing, wherein the monomer, oligomer or a combination thereof has a first terminal end coupled to the porous particulate and a second, functional terminal end, wherein the monomer, oligomer, polymer, or their combination that is operably coupled to the porous particulates are entirely embedded within the particulates and configured to leach out of the porous particulate at a temperature of between about 60° C. and about 150° C.; and a continuous phase comprising: multifunctional acrylate monomer, oligomer, polymer or their combination; a cross-linking agent; and a radical photinitiator, wherein the monomer, oligomer, polymer or their combination impregnated in the porous particulates is partially soluble in the continuous phase and/or is thermodynamically incompatible with a material forming the particulates; method of forming a reinforced thermoset board, film sheet or an article of manufacture comprising: heating the peelable substrate to a temperature of between about 60 degrees C. and about 150 degrees C., for example 110 degrees C.; ejecting the suspension composition onto the heated peelable substrate thereby leaching a portion of the monomer, oligomer, polymer or a combination thereof from the porous particulates; contacting the leached monomer, oligomer or a combination thereof with a cross-linking agent, wherein the cross-linking agent is configured to activate the radical photoinitiator; using the activated the radical photoinitiator, exposing the continuous phase to electromagnetic radiation configured to initiate radical formation in the multifunctional acrylate monomers, oligomers, polymers or their combination; and reacting the monomer, oligomer or a combination thereof from the porous particulates with the cross-linking agent and the radicalized multifunctional acrylate monomers, oligomers, polymers or their combination; wherein (xii) the cross-linking agent, co-monomer, co-oligomer or a composition comprising one or more of the foregoing are entrapped within a plurality of particulates, configured to leach out at temperatures of between about 60° C. and about 150° C., (xiii) the porous particulates are porous silica beads having mean diameter ($D_{2,1}$) of between about 10 nm and about 1000 nm, (xiv) the suspended porous particulates' concentration in the dispersed phase is equal to or greater than the 2D bond percolation threshold and below a size-dependent volume concentration conferring on the dispersed phase apparent viscosity of between about 0.1 cP·s and about 30 cP·s, at a temperature of between about 35° C. and about 55° C. (xv) is impregnated with the embedded monomer, oligomer or a combination thereof in a concentration of between about 5% and about 80% (w/w), wherein (xv) the monomer, oligomer or a combination thereof has a number average molecular weight ($\overline{MW}_n$) of between 2 and about 2000, (xvi) is independently derived from a dihydroxy compound of the formula:

wherein $R^a$ and $R^b$ each represent a halogen or $C_{1-12}$ alkyl group and can be the same or different; p and q are each independently integers of 0 to 4; and $X^a$ is a single bond, —O—, —S—, —S(O)—, —S(O)$_2$—, —C(O)—, or a $C_{1-18}$ organic group, (xvi) such as bisphenol-A, wherein (xvii) the cross linking agent is a primary or secondary polyamine and adducts thereof, an anhydride, a polyamide, polyimine, a $C_4$-$C_{30}$ polyoxyalkylene in which the alkylene groups each independently comprise 2 to 6 carbon atoms, or a composition comprising one or more of the foregoing, (xviii) the primary or secondary amine can be ethylene diamine, diethylene triamine, triethylene tetramine, tetraethylene pentamine, polyfunctional metaphenylene diamine, diamino diphenyl sulfone and mixtures comprising one or more of the foregoing, (xix) the $C_4$-$C_{30}$ polyoxyalkylene in which the alkylene groups each independently comprise 2 to 6 carbon atoms, is a poly(oxymethylene), poly(oxyethylene), poly(oxypropylene), poly(oxybutylene) or a composition comprising one or more of the foregoing, wherein (xx) the multifunctional acrylate is 1,2-ethanediol diacrylate, 1,3-propanediol diacrylate, 1,4-butanediol diacrylate, 1,6-hexanediol diacrylate, dipropylene glycol diacrylate, neopentyl glycol diacrylate, ethoxylated neopentyl glycol diacrylate, propoxylated neopentyl glycol diacrylate, tripropylene glycol diacrylate, bisphenol-A-diglycidyl ether diacrylate, hydroxypivalic acid neopentanediol diacrylate, ethoxylated bisphenol-A-diglycidyl ether diacrylate, polyethylene glycol diacrylate, trimethylolpropane triacrylate, ethoxylated trimethylolpropane triacrylate, propoxylated trimethylolpropane triacrylate, propoxylated glycerol triacrylate, tris(2-acryloyloxyethyl)isocyanurate, pentaerythritol triacrylate, ethoxylated pentaerythritol triacrylate, pentaerythritol tetraacrylate, ethoxylated pentaerythritol tetraacrylate, ditrimethylolpropane tetraacrylate, dipentaerythritol pentaacrylate and dipentaerythritol hexaacrylate or a multifunctional acrylate composition comprising one or more of the foregoing, and wherein (xxi) the radical photoinitiator is ethyl(2,4,6, trimethyl benzoil) phenyl phosphinate), benzophenone and acetophenone compounds, mixed triarylsulfonium hexafluoroantimonate salts, 2-ispropylthioxanthone or a radical photinitiator composition comprising one or more of the foregoing.

The above examples and description have of course been provided only for the purpose of illustration, and are not intended to limit the disclosed technology in any way. As will be appreciated by the skilled person, the disclosed technology can be carried out in a great variety of ways, employing more than one technique from those described above, all without exceeding the scope of the invention.

The invention claimed is:
1. A suspension composition comprising:
  a. a dispersed phase comprising a plurality of porous particulates impregnated with an embedded monomer, oligomer, or a combination comprising the foregoing, wherein the monomer, oligomer or a combination thereof has a first terminal end coupled to the porous particulate and a second, functional terminal end, wherein the embedded said embedded monomer, oligomer, or their combination that is operably coupled to the porous particulates are entirely embedded within the particulates and configured to leach out of the porous particulate at a temperature of between about 60° C. and about 150° C.; and b. a continuous phase comprising: multifunctional acrylate monomer, oligomer, polymer or their combination; a cross-linking agent; and a radical photoinitiator, wherein the monomer, oligomer, or their combination impregnated in the porous particulates is partially soluble in the continuous phase and/or is thermodynamically incompatible with a material forming the particulates.

2. The composition of claim 1, wherein the porous particulates are porous silica beads having mean diameter (D2,1) of between about 10 nm and about 1000 nm.

3. The composition of claim 2, wherein the suspended primary porous particulate concentration in the dispersed phase is equal to or greater than the 2D bond percolation threshold and below a size-dependent volume concentration conferring on the dispersed phase apparent viscosity of between about 0.1 cP·s and about 30 cP·s at a temperature of between about 35° C. and about 55° C.

4. The composition of claim 1, wherein the monomer, oligomer or a combination thereof impregnated in the porous particulates has a number average molecular weight ($\overline{MW}_n$) of between 2 and about 2000.

5. The composition of claim 1, wherein the primary porous particulate is impregnated with the monomer, oligomer or a combination thereof at a concentration of between about 5% and about 80% (w/w).

6. The composition of claim 5, wherein the monomer, oligomer or a combination thereof is independently derived from a dihydroxy compound of the formula:

wherein $R^a$ and $R^b$ each represent a halogen or $C_{1-12}$ alkyl group and can be the same or different; p and q are each independently integers of 0 to 4; and $X^a$ is a single bond, —O—, —S—, —S(O)—, —S(O)$_2$—, —C(O)—, or a $C_{1-18}$ organic group.

7. The composition of claim 6, wherein the oligomer has a first terminal end operably coupled to the primary porous particulate and a second terminal end having epoxy and is derived from bisphenol-A.

8. The composition of claim 1, wherein the multifunctional acrylate is 1,2-ethanediol diacrylate, 1,3-propanediol diacrylate, 1,4-butanediol diacrylate, 1,6-hexanediol diacrylate, dipropylene glycol diacrylate, neopentyl glycol diacrylate, ethoxylated neopentyl glycol diacrylate, propoxylated neopentyl glycol diacrylate, tripropylene glycol diacrylate, bisphenol-A-diglycidyl ether diacrylate, hydroxypivalic acid neopentanediol diacrylate, ethoxylated bisphenol-A-diglycidyl ether diacrylate, polyethylene glycol diacrylate, trimethylolpropane triacrylate, ethoxylated trimethylolpropane triacrylate, propoxylated trimethylolpropane triacrylate, propoxylated glycerol triacrylate, tris(2-acryloyloxyethyl)isocyanurate, pentaerythritol triacrylate, ethoxylated pentaerythritol triacrylate, pentaerythritol tetraacrylate, ethoxylated pentaerythritol tetraacrylate, ditrimethylolpropane tetraacrylate, dipentaerythritol pentaacrylate and dipentaerythritol hexaacrylate or a multifunctional acrylate composition comprising one or more of the foregoing.

9. The composition of claim 8, wherein the cross linking agent is a primary or secondary amine and adducts thereof, an anhydride, a polyamide, a $C_4$-$C_{30}$ polyoxyalkylene in which the alkylene groups each independently comprise 2 to 6 carbon atoms, or a composition comprising one or more of the foregoing at a concentration (w/w) of between about 0.05% (w/w composition) and about 10% (w/w composition).

10. The composition of claim 9, wherein the radical photoinitiator is ethyl (2,4,6, trimethyl benzoil) phenyl phosphinate), benzophenone and acetophenone compounds, mixed triarylsulfonium hexafluoroantimonate salts, 2-ispropylthioxanthone or a radical photoinitiator composition comprising one or more of the foregoing present at a concentration of between about 0.01% (w/w composition) and about 8.0% (w/w).

11. An inkjet ink comprising the composition of claim 1.

* * * * *